(12) United States Patent
Wang et al.

(10) Patent No.: US 12,255,464 B2
(45) Date of Patent: Mar. 18, 2025

(54) ISLANDING DETECTION METHOD AND APPARATUS

(71) Applicant: Huawei Digital Power Technologies Co., Ltd., Shenzhen (CN)

(72) Inventors: Xiongfei Wang, Aalborg (DK); Fangcheng Liu, Shenzhen (CN); Teng Liu, Aalborg (DK)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/316,395

(22) Filed: May 12, 2023

(65) Prior Publication Data

US 2023/0378765 A1    Nov. 23, 2023

(30) Foreign Application Priority Data

May 19, 2022  (CN) .......................... 202210545809.7

(51) Int. Cl.
*H02J 3/38* (2006.01)
*G01R 19/25* (2006.01)

(52) U.S. Cl.
CPC .......... *H02J 3/388* (2020.01); *G01R 19/2513* (2013.01); *H02J 3/381* (2013.01); *H02J 2300/24* (2020.01)

(58) Field of Classification Search
CPC ........ H02J 3/388; H02J 2300/24; H02J 3/381; G01R 19/2513

See application file for complete search history.

(56) References Cited

U.S. PATENT DOCUMENTS

| | | | |
|---|---|---|---|
| 2014/0265596 A1* | 9/2014 | Yuan ...................... | H02J 3/381 307/69 |
| 2015/0380940 A1* | 12/2015 | Bhowmik ............... | H02J 3/381 307/69 |
| 2020/0403410 A1 | 12/2020 | Yamamoto | |
| 2022/0368154 A1* | 11/2022 | Allert ...................... | H02J 3/381 |

FOREIGN PATENT DOCUMENTS

CN    115085367 A    9/2022

* cited by examiner

*Primary Examiner* — Ryan Johnson
(74) *Attorney, Agent, or Firm* — Maier & Maier, PLLC

(57) ABSTRACT

An islanding detection method includes: an alternating current frequency of an inverter is monitored. The alternating current frequency fluctuates within a preset range when in a normal mode. When an instantaneous shifting value of the alternating current frequency exceeds the preset range, a frequency detected before instantaneous shifting is a first frequency. When a frequency in first frequency data within a first preset time period is greater than or less than only the first frequency, an alternating current frequency detected when the first preset time period ends is a second frequency. Output power of the inverter is continuously adjusted based on a change in the current alternating current frequency. When a frequency in second frequency data within a second preset time period is greater than or less than only the second frequency, it may be indicated in time that islanding occurs in the inverter, and an islanding status is reported.

11 Claims, 7 Drawing Sheets

ISLANDING DETECTION METHOD AND APPARATUS

CROSS-REFERENCE TO RELATED APPLICATION

This application claims priority to Chinese Patent Application No. 202210545809.7, filed on May 19, 2022, which is hereby incorporated by reference in its entirety.

STATEMENT OF JOINT RESEARCH AGREEMENT

The subject matter and the claimed invention were made by or on the behalf of Aalborg University, of Aalborg, Denmark and Huawei Digital Power Technologies Co., Ltd., of Shenzhen, Guangdong Province, P.R. China, under a joint research agreement titled "Inverter islanding detection technology." The joint research agreement was in effect on or before the claimed invention was made, and that the claimed invention was made as a result of activities undertaken within the scope of the joint research agreement.

TECHNICAL FIELD

The embodiments relate to the communication field, an islanding detection method, and an apparatus.

BACKGROUND

Energy transition is a trend of global energy development. With collaborative development of new technologies of a power supply side, a grid side, a load side, and the like, a traditional electrical power system gradually evolves to a new energy electrical power system dominated by a power electronic device. The traditional electrical power system is dominated by a large rotary generator, to maintain a stable system voltage and frequency. A small quantity of power electronic devices control currents of the power electronic devices based on the system voltage and frequency, that is, work in a grid following mode. In the new energy electrical power system, a proportion of rotary generators decreases or even reaches zero, and the power electronic devices maintain a stable system voltage and frequency, that is, work in a grid forming mode. During actual operation of the electrical power system, faults and the like may occur due to various reasons, resulting an islanding grid or islanding system.

Currently, occurrence of islanding is determined by detecting whether large shifting in the system voltage or frequency is caused by small disturbances that are generated in a voltage, a frequency, and power of a current output of the power electronic device. However, in the grid forming mode, large instantaneous shifting in the system voltage or frequency may also occur during normal load switching, and in the grid forming mode, an inverter actively regulates the system voltage or frequency. Consequently, islanding detection accuracy is not high.

SUMMARY

The embodiments may provide an islanding detection method and apparatus, to reduce misjudgment and improve islanding detection accuracy.

A first aspect provides an islanding detection method, including: An alternating current frequency of an inverter is detected in real time. The alternating current frequency fluctuates within a preset range when the inverter is in a normal control mode. After an instantaneous shifting value of the alternating current frequency exceeds the preset range, when all frequencies in first frequency data within a first preset time period are greater than or less than only a first frequency, output power of the inverter is continuously adjusted based on a change in the alternating current frequency. The first frequency is an alternating current frequency detected before the instantaneous shifting value exceeds the preset range, and the output power is used to affect a magnitude of the alternating current frequency. When all frequencies in second frequency data of the alternating current frequency within a second preset time period are greater than or less than only a second frequency, an islanding status is reported. The second frequency is an alternating current frequency detected when the first preset time period ends, and the islanding status indicates that islanding occurs in the inverter.

In the foregoing aspect, the alternating current frequency of the inverter is monitored. The alternating current frequency fluctuates within the preset range when the inverter is in the normal control mode. When the instantaneous shifting value of the alternating current frequency exceeds the preset range, an alternating current frequency detected before shifting is the first frequency. The first frequency data within the first preset time period may be counted. If the first frequency data is greater than or less than only the first frequency, the alternating current frequency detected when the first preset time period ends is set to the second frequency. The output power of the inverter is continuously adjusted based on the change of the current alternating current frequency, so that the alternating current frequency changes, and the alternating current frequency within the second preset time period is the second frequency data. When the second frequency data is still greater than or less than only the second frequency, it may be indicated in time that islanding occurs in the inverter, and an islanding status is reported, to disconnect the inverter from a local load. In the two-time determining manner, two situations of islanding occurrence and normal load switching are distinguished, to reduce misjudgment, prevent the inverter from actively adjusting a system voltage or frequency, and improve accuracy of islanding detection.

In a possible implementation, before the determining that islanding occurs in the inverter in the foregoing step, the method further includes: When the frequency in the second frequency data does not meet a preset frequency range, a step of reporting the islanding status is triggered.

In the foregoing possible implementation, an islanding detection apparatus may further report the islanding status only when it is determined that the frequency in the second frequency data exceeds the preset frequency range when all the frequencies in the second frequency data are distributed on one side of the second frequency, to improve detection accuracy.

In a possible implementation, the step in which the output power of the inverter is continuously adjusted based on the change of the alternating current frequency includes: The output power is increased when the alternating current frequency increases. The output power is reduced when the alternating current frequency decreases.

In the foregoing possible implementation, the inverter is switched to an islanding detection control mode. In this case, the output power is in an unstable control state, and the output power is adjusted based on a positive feedback relationship between the alternating current frequency and the output power, to improve accuracy of islanding detection.

In a possible implementation, the output power is output active power or output reactive power, the output active power is an average value of instantaneous power output by the inverter in a cycle, and the output reactive power is a power value of energy exchange of the inverter in a cycle.

In a possible implementation, the inverter works in a grid forming mode, and the inverter maintains voltage and frequency stability of a photovoltaic power supply system.

A second aspect provides an islanding detection apparatus, and the apparatus can implement the method in any one of the first aspect or the possible implementations of the first aspect. The apparatus includes a corresponding unit or module for performing the foregoing method. The unit or module included in the apparatus can be implemented by software and/or hardware. For example, the apparatus may be a network device, or may be a chip, a chip system, a processor, or the like that supports a network device in implementing the foregoing method or may be a logic module or software that can implement all or some functions of a network device.

A third aspect provides a photovoltaic power supply system, including an inverter circuit, a controller, and the islanding detection apparatus according to the second aspect. The inverter circuit is connected to an islanding detection circuit and a control circuit, and the control circuit is connected to the islanding detection apparatus. The inverter circuit is configured to convert direct current electric energy into alternating current electric energy; and the controller includes the islanding detection apparatus in the second aspect.

A fourth aspect provides a computer device, including: a processor. The processor is coupled to a memory, the memory is configured to store instructions, and when the instructions are executed by the processor, the computer device is enabled to implement the method in any one of the first aspect or the possible implementations of the first aspect. The computer device may be, for example, a network device, or may be a chip or a chip system that supports a network device in implementing the foregoing method.

A fifth aspect provides a non-transitory computer-readable storage medium. The non-transitory computer-readable storage medium stores instructions, and when the instructions are executed by a processor, the method provided in any one of the first aspect or the possible implementations of the first aspect is implemented.

DETAILED DESCRIPTION OF THE EMBODIMENTS

The embodiments may provide an islanding detection method and apparatus, to reduce misjudgment and improve islanding detection accuracy.

The following describes the embodiments with reference to accompanying drawings. It is clear that the described embodiments are merely some but not all of the embodiments. A person of ordinary skill in the art may learn that, with development and emergence of a new scenario, the solutions provided in the embodiments are also applicable to a similar problem.

In the embodiments and accompanying drawings, the terms such as "first" and "second" are intended to distinguish between similar objects but do not necessarily indicate an order or sequence. It should be understood that the terms used in such a way are interchangeable in proper circumstances so that the embodiments described herein can be implemented in orders other than the order illustrated or described herein. Moreover, the terms "include", "contain" and any variant thereof are intended to cover a non-exclusive inclusion. For example, a process, method, system, product, or device that includes a list of steps or units is not necessarily limited to those steps or units that are expressly listed but may include other steps or units not expressly listed or are inherent to the process, method, product, or device.

The term "example" herein means "used as an example, embodiment or illustration". Any embodiment described as an "example" is not necessarily explained as being superior or better than the other embodiments.

In addition, numerous details are given in the following implementations. A person skilled in the art should understand that the embodiments can also be implemented without some of the details. In some embodiments, methods, means, elements, and circuits that are well-known to a person skilled in the art are not described in detail, so that the subject matter is highlighted.

Figure 1:
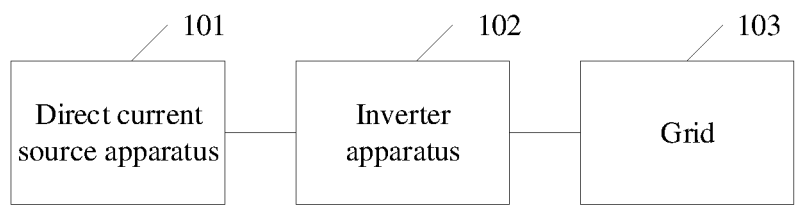
FIG. 1 is a schematic diagram of a structure of an electrical power system according to an embodiment.

FIG. 1 is a schematic diagram of a structure of an electrical power system according to an embodiment.

As shown in FIG. 1, the electrical power system includes a direct current source apparatus 101, an inverter apparatus 102, and a grid 103. The direct current source apparatus 101 is connected to the inverter apparatus 102, and the inverter apparatus 102 is connected to the grid 103.

The direct current source apparatus 101 includes one or more direct current sources. The plurality of direct current sources may be connected in parallel, and any direct current source is used to provide a direct current. The direct current source may be a device such as a photovoltaic cell or a wind energy cell. In a photovoltaic field, the direct current source included in the direct current source apparatus may also be referred to as a photovoltaic cell panel.

The inverter apparatus 102 is configured to convert the direct current output by the direct current source apparatus 101 into an alternating current, and feed the alternating current obtained through conversion to the power grid 103 by using a transformer. The inverter apparatus 102 includes one or more inverters. The plurality of inverters may be connected in parallel.

The grid 103 is configured to obtain electricity from electricity output by the inverter apparatus 102, and power used by the grid 103 by obtaining the electricity from the electricity output by the inverter apparatus 102 may also be referred to as grid-connected power. When the electrical power system shown in FIG. 1 is used, the grid-connected power of the grid 103 is constant. However, output power of the direct current source included in the direct current source apparatus 101 may be unstable. For example, output power of the photovoltaic cell during daytime is different from output power of the photovoltaic cell at night. Therefore, to ensure stability of the grid-connected power of the grid 103, the electrical power system may further include an energy storage system (not shown in the figure), and the energy storage system is connected to the inverter apparatus 102.

Energy transition is a trend of global energy development. With collaborative development of new technologies of a power supply side, a grid side, a load side, and the like, a traditional electrical power system gradually evolves to a new energy electrical power system dominated by a power electronic device. The traditional electrical power system is dominated by a large rotary generator, to maintain a stable system voltage and frequency. A small quantity of power electronic devices control currents of the power electronic devices based on the system voltage and frequency, that is, work in a grid following mode. In the new energy electrical power system, a proportion of rotary generators decreases or even reaches zero, and the power electronic devices maintain a stable system voltage and frequency, that is, work in a grid forming mode. During actual operation of the electrical power system, faults may occur due to various reasons, resulting an islanding grid or islanding system.

An islanding effect of the inverter means: When a grid-connected switch trips, the inverter fails to detect a power-off state in time and cuts itself off from the grid, and finally a self-powered islanding power generation system including the inverter and the load is formed. The islanding effect brings the following harm to an electrical power system and personnel concerned:

(1) The grid-connected switch and a related device may be damaged due to out-of-synchronization closing.
(2) Maintenance personnel who consider that a line is uncharged is subject to safety threats.
(3) The islanding effect may result in a fault removal failure and affect grid recovery.

Figure 2:
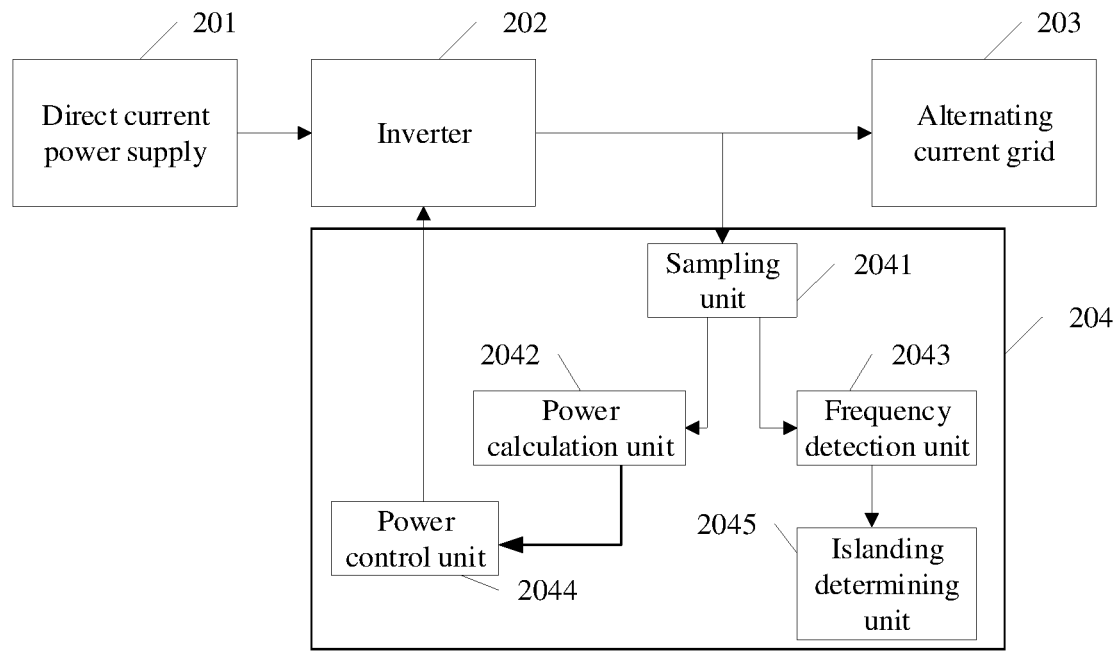
FIG. 2 is a schematic diagram of a structure of a current islanding detection solution according to an embodiment.

A current islanding detection solution is shown in FIG. 2. The solution includes a direct current power supply 201, an inverter 202, an alternating current grid 203, and a control apparatus 204. The control apparatus 204 includes a sampling unit 2041, a power calculation unit 2042, a frequency detection unit 2043, a power control unit 2044, and an islanding determining unit 2045.

The sampling unit 2041 includes voltage sampling and current sampling, and is configured to convert, at an alternating current port of the inverter, an alternating current and an alternating voltage in a power system (a strong current system) into a corresponding signal in a control system (a weak current system) and implement electrical isolation between the two systems.

Functions of the power calculation unit 2042 and the frequency detection unit 2043 are to perform power calculation and alternating current frequency estimation based on an alternating voltage and a current signal obtained by the sampling unit through sampling, to obtain actual active power and reactive power output by the inverter and an alternating current frequency of the alternating voltage through calculation.

The power control unit 2044 performs an output power control function of the inverter and is configured to ensure that actual power output by the inverter meets a control requirement, for example, ensure a requirement of active power, reactive power, and a power factor. The power control unit further includes a modulation function, that is, converting a modulated wave output by the control unit into a semiconductor switch drive signal matching an inverter topology apparatus, and directly controlling an on or off state of a semiconductor in the inverter topology apparatus. Values of current active power and reactive power input by the power control unit 2044 need to be fixed values.

The islanding determining unit 2045 may determine whether islanding is generated based on whether a terminal voltage amplitude, frequency, phase, and harmonic output by the inverter are abnormal. Based on different detection objects, the detection method may be further classified into an over/undervoltage detection method, an over/underfrequency detection method, a voltage phase jump detection method, a voltage harmonic detection method, and the like. However, a main disadvantage of this solution is that a detection blind area is relatively large. For example, when a distributed power supply matches a local load well, an islanding microgrid frequency is maintained in a range of 49.5-50.5 Hz, and the foregoing over/underfrequency detection method fails. To reduce the detection blind area, sensitivity of an apparatus needs to be improved, but a threshold is difficult to set.

In another solution, occurrence of islanding is determined by detecting whether large shifting in a system voltage or frequency is caused by small disturbances that are generated in a voltage, a frequency, and power of a current output of a power electronic device. However, in a grid forming mode, large instantaneous shifting in the system voltage or frequency may also occur during normal load switching, and in the grid forming mode, an inverter actively regulates the system voltage or frequency. Consequently, islanding detection accuracy is not high.

To resolve the foregoing problems, the embodiments may provide an islanding detection method. The method is described as follows.

Figure 3:
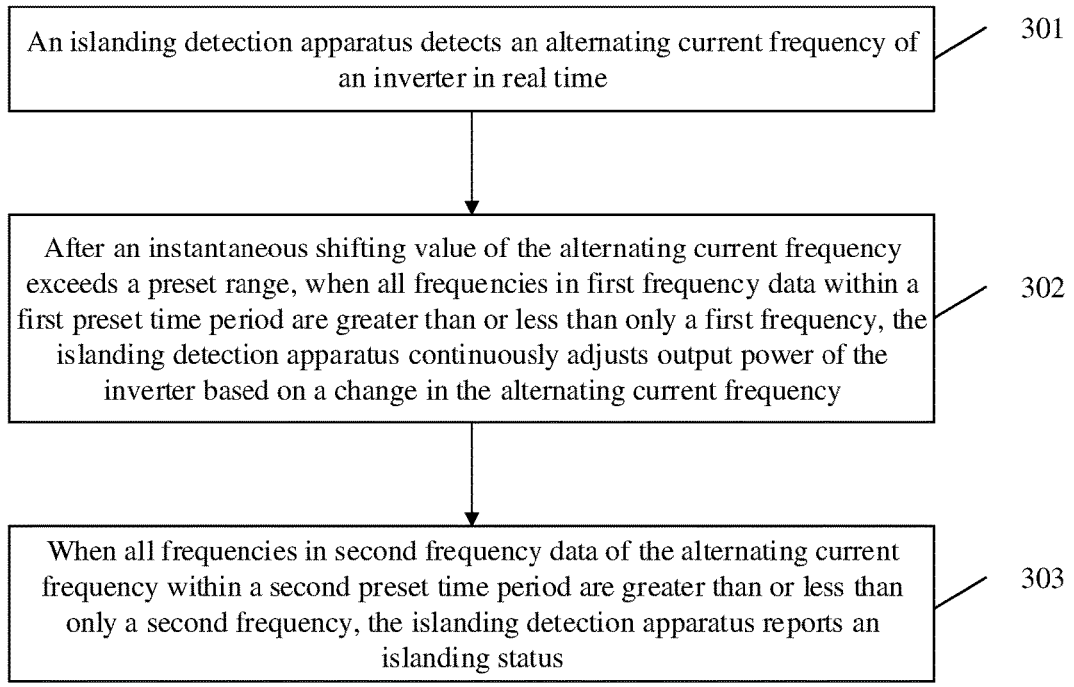
FIG. 3 is a schematic flowchart of an islanding detection method according to an embodiment.

FIG. 3 is a schematic flowchart of an islanding detection method according to an embodiment. The method includes the following steps.

Step 301: An islanding detection apparatus detects an alternating current frequency of an inverter in real time. The alternating current frequency fluctuates within a preset range when the inverter is in a normal control mode.

In this embodiment, it should be noted that, the inverter is an important component of a new energy electrical power system, and converts a direct current generated by a power generation apparatus such as a photovoltaic cell or a draught fan in the new energy electrical power system into an alternating current, and then feeds the alternating current to a grid. An alternating current port of the inverter is configured to transmit the alternating current to the grid. When islanding occurs in the inverter, the alternating current frequency changes abruptly, and large shifting occurs in a short time. Therefore, islanding may be detected based on a change of the alternating current frequency. The islanding detection apparatus may obtain an alternating current frequency of the alternating current port of the inverter in real time for detection. The frequency is a quantity of times of periodic changes completed within a unit time. The alternating current frequency may be a frequency of a voltage of the alternating current or may be a frequency of a current of the alternating current. The frequency of the voltage in this embodiment is used as an example. For example, the sampling unit 2041 in FIG. 2 may collect an alternating current voltage of the alternating current port of the inverter in real time and send the alternating current voltage to the frequency detection unit 2043. The frequency detection unit 2043 performs alternating current frequency estimation on the alternating current voltage and sends the estimated alternating current frequency to the islanding detection apparatus. This embodiment may be applied to a grid forming mode. The inverter can maintain voltage and frequency stability of a photovoltaic power supply system. When the inverter is in the normal control mode, the alternating current frequency of the inverter may float in the preset range. In the normal control mode, the values of the active power and reactive power input by the power control unit 2044 in FIG. 2 are fixed values.

Step 302: After an instantaneous shifting value of the alternating current frequency exceeds the preset range, when all frequencies in first frequency data within a first preset time period are greater than or less than only a first frequency, output power of the inverter is continuously adjusted based on the change in the alternating current frequency. The first frequency is an alternating current frequency detected before the instantaneous shifting value exceeds the preset range, and the output power is used to affect a magnitude of the alternating current frequency.

In this embodiment, when the islanding detection apparatus detects that the alternating current frequency instantaneously shifts, and the instantaneous shifting value exceeds the preset range in which the alternating current frequency floats, islanding may occur in the inverter. In this case, a frequency value that is of the alternating current frequency and that is detected before shifting is the first frequency.

After the alternating current frequency instantaneously shifts, the islanding detection apparatus may obtain the first frequency data of the alternating current frequency within the first preset time period, that is, count a value of the alternating current frequency within the first preset time period after the alternating current frequency instantaneously shifts beyond the preset range, and use the value as the first frequency data, and compare the frequency in the first frequency data with the first frequency. If the first frequency data includes both data that is less than the first frequency and data that is greater than the first frequency, it may be determined that no islanding occurs in the inverter, and the power supply system processes a situation in which normal load switching occurs and a sudden change occurs in the system power/voltage. If all the frequencies in the first frequency data are greater than or less than only the first frequency, that is, when all the frequencies are distributed only on one side of the first frequency in a waveform diagram, it may be determined that islanding is suspected to occur in the inverter. In this case, a working mode of the inverter is changed from a normal control mode to an islanding detection control mode. The islanding detection apparatus may use the currently obtained alternating current frequency as a second frequency, and continuously adjust, starting from the second frequency, the output power of the inverter based on a change of a subsequently obtained alternating current frequency, so that an alternating current frequency output by the inverter subsequently changes accordingly. The subsequently collected alternating current frequency and the output power of the inverter are in a positive feedback relationship. When the alternating current frequency increases, the output power of the inverter is increased; or when the alternating current frequency decreases, the output power of the inverter is decreased. For example, the islanding detection apparatus may control the output power of the inverter by adjusting a power value input by the power control unit in FIG. 2. The input power value is subsequent output power of the inverter. The output power of the inverter adjusted by the islanding detection apparatus based on the change of the alternating current frequency may be output active power or output reactive power. It should be noted that the output active power is an average value of instantaneous power emitted by a the inverter in a cycle, and is electrical power required for maintaining normal operation of an electric device, that is, electrical power for converting electric energy into another form of energy (mechanical energy, optical energy, and thermal energy), and the output reactive power is a power value obtained through exchanging between magnetic field (or electric field) energy of an inductance (a capacitor) and power supply energy within a cycle of the inverter. The output active power as an example is used as an example in this embodiment.

Step 303: When all frequencies in second frequency data of the alternating current frequency within a second preset time period are greater than or less than only the second frequency, the islanding detection apparatus reports an islanding status. The second frequency is an alternating current frequency detected when the first preset time period ends, and the islanding status indicates that islanding occurs in the inverter.

In this embodiment, the islanding detection apparatus may set the second preset time period, and the second preset time period may be the same as or different from the first preset time period. This is not limited herein. After obtaining the currently obtained alternating current frequency as the second frequency, the islanding detection apparatus may use the second preset time period as a time limit, adjust the output power of the inverter only within the time limit, count the alternating current frequency collected within the second preset time period as the second frequency data, and then compare the frequency in the second frequency data with the second frequency. When no islanding phenomenon occurs, the inverter is connected to the grid. In the islanding detection mode, the frequency of the alternating current output by the alternating current port of the inverter fluctuates around the second frequency, that is, a waveform diagram of the alternating current output by the alternating current port of the inverter is not only on one side of the second frequency, so that it can be accurately detected that no islanding phenomenon occurs. That is, when the alternating current frequency of the inverter suddenly changes, a grid-connected inverter does not directly perform islanding protection. In this way, a situation in which the grid-connected inverter performs islanding protection by mistake due to load switching of the power supply system can be avoided.

However, after the islanding phenomenon occurs, under the effect of a frequency positive feedback feature related to the islanding phenomenon, the frequency of the alternating current output by the alternating current port of the inverter in the islanding detection mode may be quickly shifted, and a situation in which the frequencies in the second frequency data are all greater than or less than the second frequency may occur, that is, the frequencies in the second frequency data are distributed only on one side of the second frequency in the waveform diagram, so that the islanding phenomenon can be accurately detected. Occurrence of the island phenomenon is quickly detected, so that a detection time is reduced, reliability and security are improved, and then the islanding status can be reported, to quickly implement island protection. An islanding protection operation may be as follows. (1) The inverter switches to an islanding status mode to continue to work, and supplies power to a load (power load). (2) The inverter is shut down, where a photovoltaic module does not supply power to the grid, for example, by stopping outputting an alternating current through an alternating current port of the grid-connected inverter. In this embodiment, islanding protection may alternatively be performed in another manner. This is not limited in this embodiment.

Figure 4:
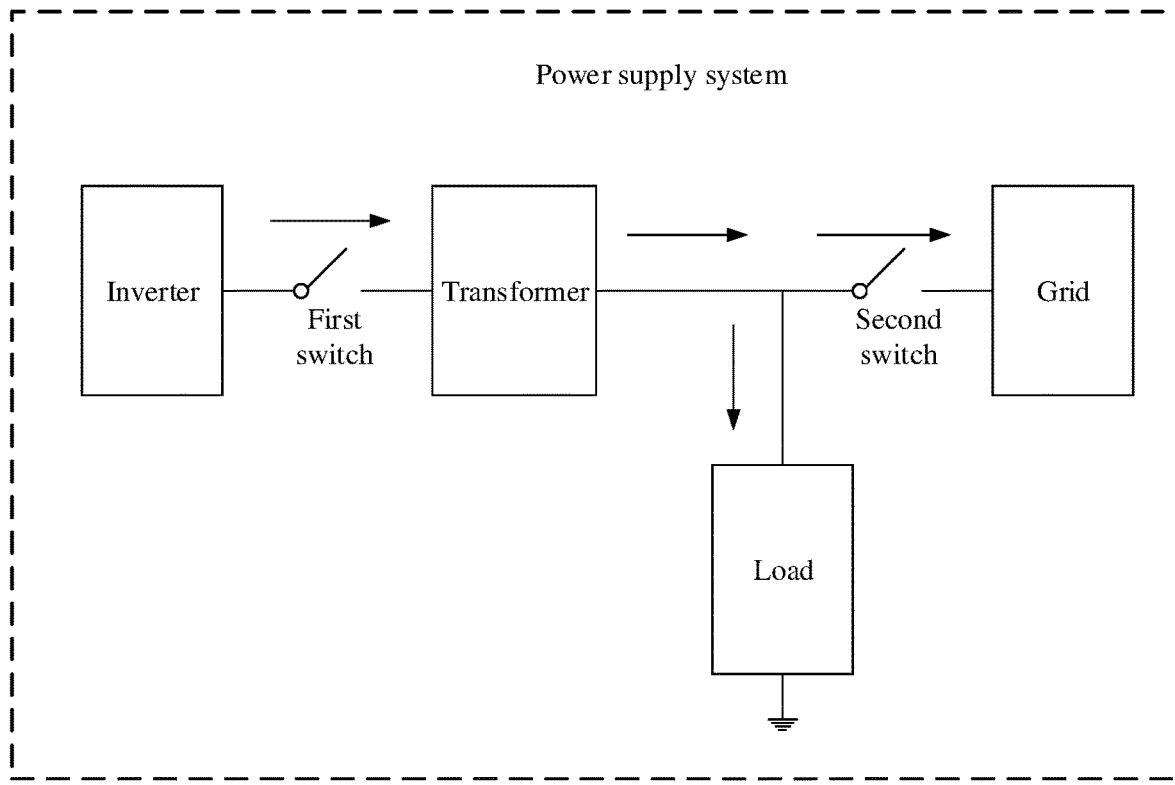
FIG. 4 is a schematic diagram of a structure of a photovoltaic power supply system according to an embodiment.

For example, as shown in FIG. 4, a photovoltaic power supply system includes an inverter, a transformer, and a load. An alternating current port of the inverter is connected to the transformer by using a first switch, an output end of the transformer is connected to a grid by using a second switch, and the output end of the transformer is connected to the load. When the grid is powered off, the second switch is turned on, and a connection between the photovoltaic power supply system and the grid is disconnected. In this case, the inverter continues to supply power to the load, consequently causing an islanding phenomenon. When the occurrence of the islanding phenomenon is detected by using the islanding phenomenon detection method provided in this embodiment, the first switch may be turned on, to stop outputting the alternating current through the alternating current port of the inverter. In this way, the inverter no longer supplies power to the load, thereby implementing islanding protection. Optionally, in this embodiment, after detecting that islanding occurs in the inverter, the islanding detection apparatus may further report the islanding status to an upper-layer controller, and the upper-layer controller performs an operation of disconnecting the inverter from a local load, or the upper-layer controller controls the inverter to enter another mode. This is not limited herein.

In an example, the islanding detection apparatus may further determine that islanding occurs in the inverter when the frequencies in the second frequency data are all greater than or lower than the second frequency and it is determined that the frequency in the second frequency data exceeds a preset frequency range, so that detection accuracy can be improved.

For example, if no islanding occurs, a frequency of an alternating current bus voltage maintains stable by a large grid and gradually is called back to a value close to a normal value, and no large shifting occurs, that is, obtained second frequency data is distributed in both sides of the second frequency along with the callback process. If islanding occurs, that is, there is no support from the large grid, the frequency of the alternating current bus voltage is continuously shifted with a frequency positive feedback mechanism of the inverter until system protection is triggered. In this way, the islanding phenomenon is detected.

Figure 5:
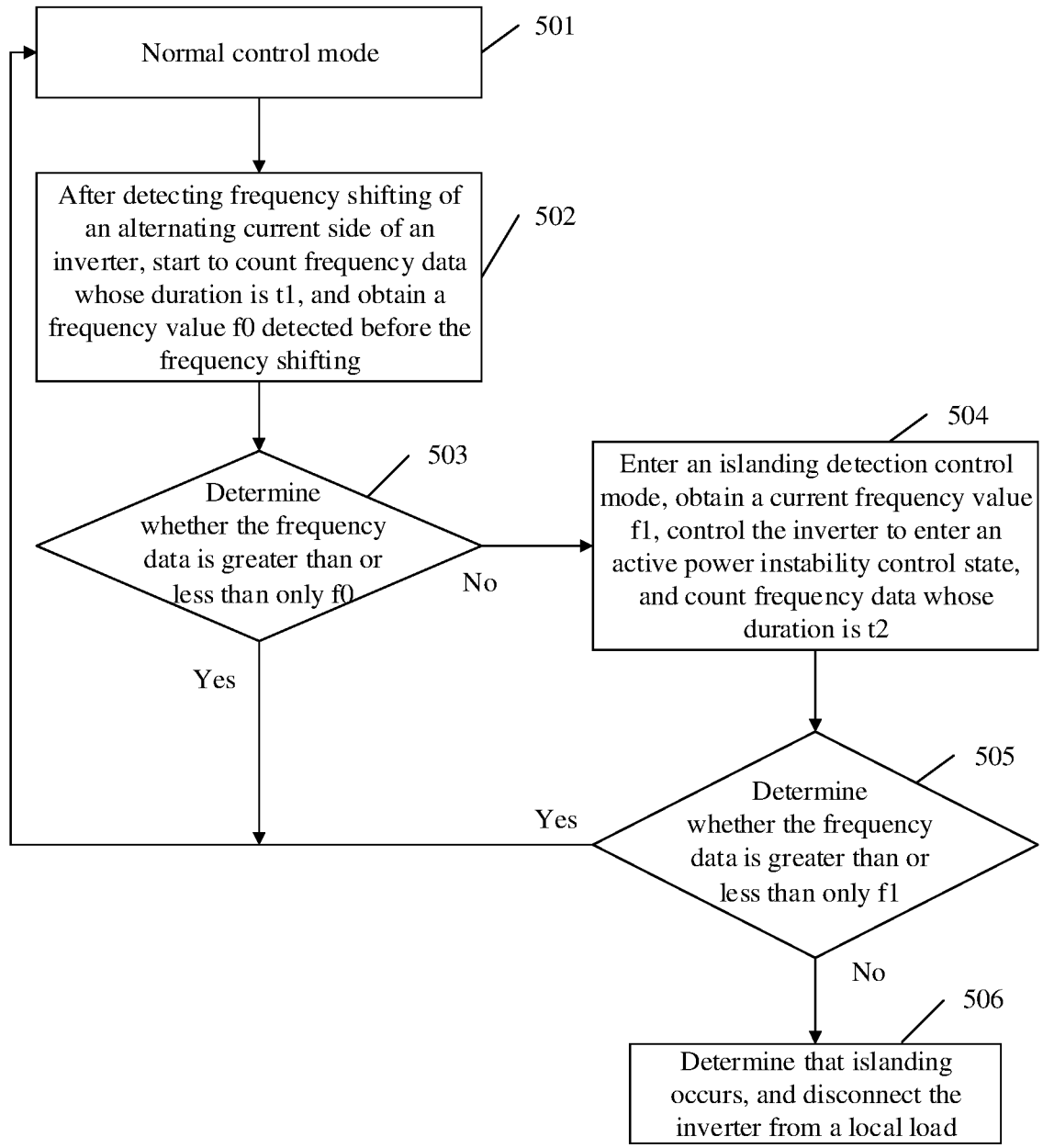
FIG. 5 is a schematic diagram of a detection process according to an embodiment.

The islanding detection apparatus in this embodiment may improve the islanding determining unit 2045 in the control apparatus 204 in FIG. 2. Steps performed by the islanding detection method may be shown in a schematic diagram of a detection process shown in FIG. 5. Step 501: The islanding detection apparatus is in a normal control mode and starts detection. Step 502: After detecting frequency shifting of an alternating current side of the inverter, the islanding detection apparatus starts to count frequency data whose duration is t1 and obtains a frequency value f0 detected before the frequency shifting. Step 503: The islanding detection apparatus determines a shifting situation of the obtained frequency data, where if the obtained frequency data fluctuates on both sides of f0, it is considered that no islanding occurs, and the detection ends, and step 501 is performed; or if the obtained frequency data is greater than or less than f0, step 504 is performed. Step 504: The islanding detection apparatus enters an islanding detection control mode, obtains a current frequency value f1, and controls the inverter to enter an active power instability control state. For example, output active power P is a frequency f positive feedback mode, that is, when the frequency f increases, the active power input by the power control unit 2044 is increased, so that the power control unit 2044 controls the inverter to increase the output active power; and when the frequency f decreases, the active power input by the power control unit 2044 is reduced, so that the control unit 2044 controls the inverter to reduce the output active power and starts to count frequency data whose duration is t2. Step 505: Determine the shifting situation of the obtained frequency data, where if the obtained frequency data is distributed on both sides of f1, it is considered that no islanding occurs, and the detection ends, and step 501 is returned to; or if the obtained frequency data is greater than or less than f1 and the frequency is greater than a lower limit of an islanding detection frequency threshold or an upper limit of the islanding detection frequency threshold, step 506 is performed. Step 506: The islanding detection apparatus determines that islanding occurs and disconnects the inverter from the local load.

Figure 6:
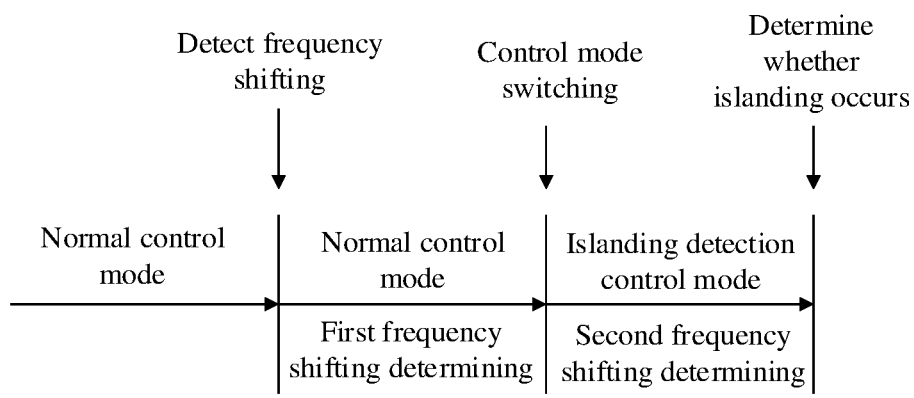
FIG. 6 is a schematic diagram of a time sequence of an islanding detection method according to an embodiment.

FIG. 6 is a schematic diagram of a time sequence of an islanding detection method according to an embodiment. A system keeps stable at the beginning, an inverter is in a normal control mode, and a frequency remains unchanged. When islanding or load switching occurs in the system, the system frequency fluctuates. After frequency shifting is detected, a frequency value detected before the frequency shifting is f0, and first frequency shifting determining starts. In this case, the control mode remains unchanged.

Figure 7:
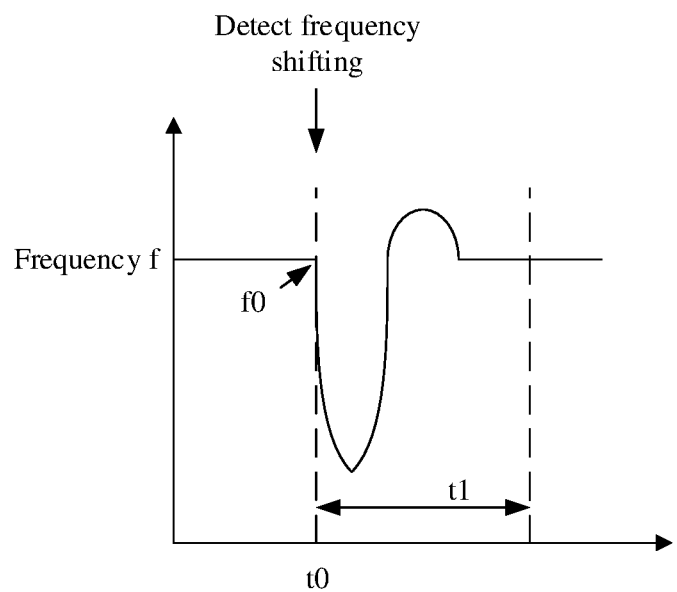
FIG. 7 is a schematic diagram of a normal load switching situation according to an embodiment.
Figure 8:
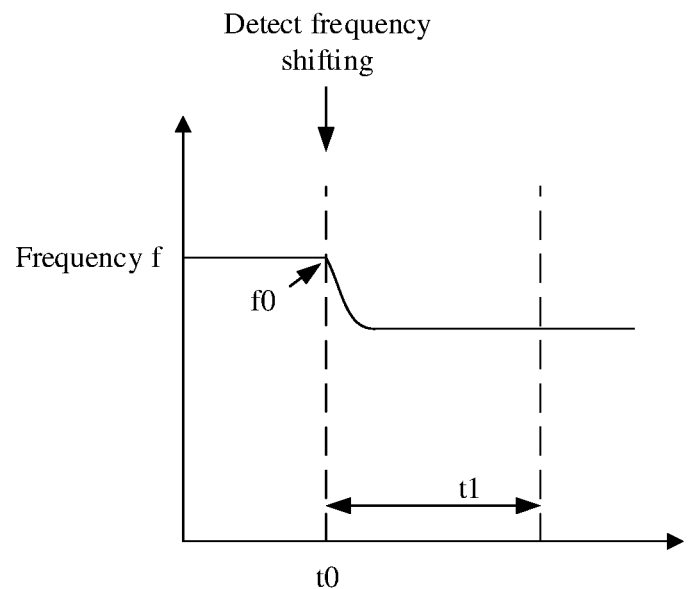
FIG. 8 is a schematic diagram of a situation in which suspected islanding occurs according to an embodiment.

There are two reasons for a system frequency change: normal load switching and islanding occurring. If normal load switching occurs, the frequency is kept stable by a large grid and is called back to near a rated frequency. Therefore, a normal load switching situation appears as shown in FIG. 7, and the system frequency is distributed above and below f0 due to the callback. Further, no islanding occurs in the inverter, and the inverter returns to the normal control mode. If islanding occurs, due to lacking a frequency stability capability of the large grid, the system frequency is likely to remain greater than or less than f0. For example, a suspected islanding situation shown in FIG. 8 may occur, and the system frequency is always less than f0.

However, due to impact of an adjustment capability of the large grid, normal load switching may also occur. Because system adjustment is slow, the system frequency always maintains less than f0 in a t1 interval. Therefore, it cannot be completely determined that islanding occurs in the system based on the situation shown in FIG. 8. Therefore, after t1, the control mode of the inverter needs to be switched, further active detection is performed, and the frequency value detected before a mode switching moment is f1.

Figure 9:
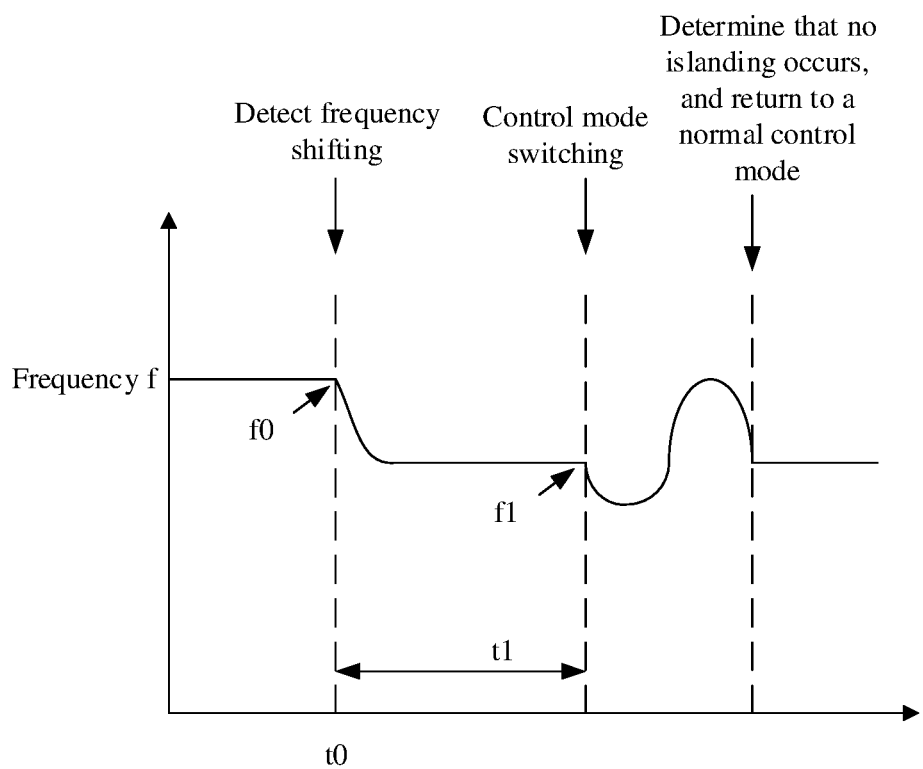
FIG. 9 is a schematic diagram of a situation in which no islanding occurs according to an embodiment.
Figure 10:
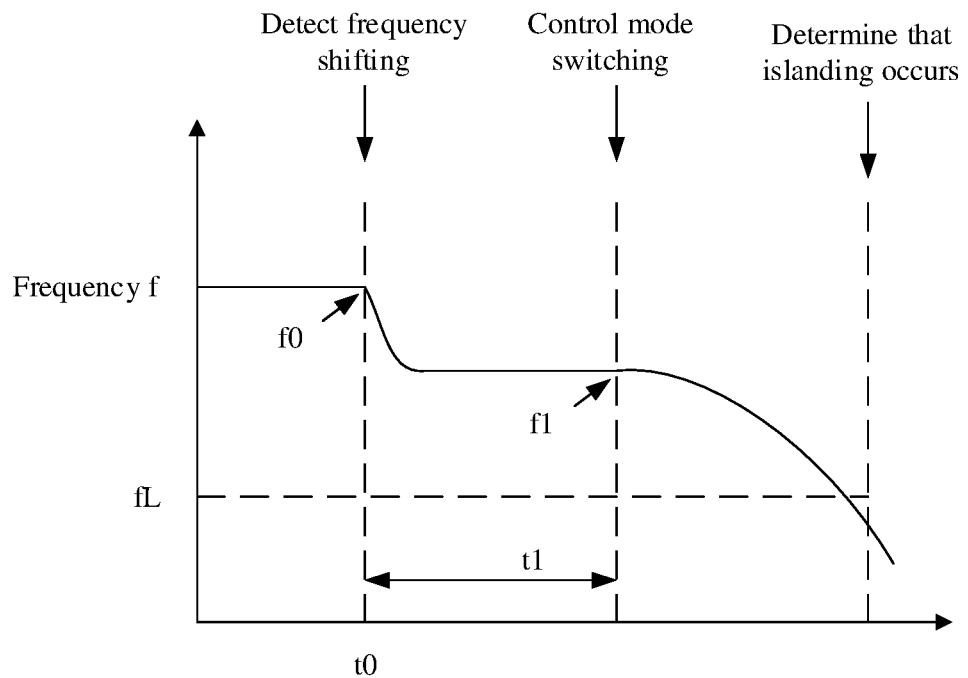
FIG. 10 is a schematic diagram of a situation in which islanding occurrence is determined according to an embodiment.

In this case, there are still two situations. A waveform in FIG. 8 continues to develop into a situation in which no island occurs in FIG. 9 or a situation in which islanding occurs in FIG. 10. If no islanding occurs, the frequency is kept stable by the large grid and is called back to a value close to the rated frequency. Therefore, a situation shown in FIG. 9 occurs. The system frequency is distributed above and below f1. In this case, it is determined that no islanding occurs, and the inverter returns to the normal control mode. If islanding occurs, due to lacking the frequency stability capability of the large grid, the system frequency is affected by the inverter instability control mode. Therefore, the system frequency is gradually shifted and cannot return to the normal value until the system frequency decreases to the lower limit of the islanding detection frequency threshold. In this case, it is determined that islanding occurs, as shown in FIG. 10.fL In this embodiment, the alternating current frequency of the inverter in the normal control mode is monitored. When the shifting value of the alternating current frequency within a preset time period exceeds the preset range, the alternating current frequency detected before the shifting is the first frequency, and the first frequency data within the first preset time period may be counted. If the first frequency data is greater than or less than only the first frequency, the alternating current frequency detected when the first preset time period ends is set to the second frequency, and the output power of the inverter is continuously adjusted based on the change of the current alternating current frequency. In this way, the alternating current frequency changes, and the alternating current frequency within the second preset time period is obtained as the second frequency data. When the second frequency data is still greater than or less than only the second frequency, it may be indicated in time that islanding occurs in the inverter, and an islanding status is reported. In the two-time determining manner, two situations of islanding occurrence and normal load switching are distinguished, to reduce misjudgment, prevent the inverter from actively adjusting a system voltage or frequency, and improve accuracy of islanding detection.

The islanding detection method is described above, and an apparatus for executing the method is described below.

Figure 11:
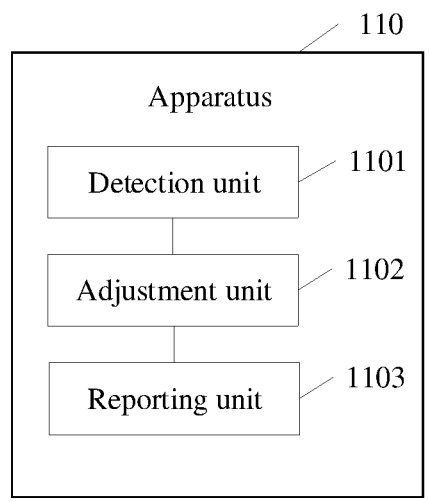
FIG. 11 is a schematic diagram of a structure of an islanding detection apparatus according to an embodiment.

FIG. 11 is a schematic diagram of a structure of an islanding detection apparatus according to an embodiment. The apparatus 110 includes:

a detection unit 1101, configured to detect an alternating current frequency of an inverter in real time, where the alternating current frequency fluctuates within a preset range when the inverter is in a normal control mode;

an adjustment unit 1102, configured to: after an instantaneous shifting value of the alternating current frequency exceeds the preset range, when all frequencies in first frequency data within a first preset time period are greater than or less than only a first frequency, continuously adjust output power of the inverter based on a change in the alternating current frequency, where the first frequency is an alternating current frequency detected before the instantaneous shifting value exceeds the preset range, and the output power is used to affect a magnitude of the alternating current frequency; and a reporting unit 1103, configured to: when all frequencies in second frequency data of the alternating current frequency within a second preset time period are greater than or less than only a second frequency, report an islanding status, where the islanding status indicates that islanding occurs in the inverter.

Optionally, the apparatus 110 further includes a determining unit (not shown in the figure). The determining unit may be configured to: when the frequency in the second frequency data does not meet a preset frequency range, trigger the reporting unit 1103.

Optionally, the adjustment unit 1102 may be configured to: increase the output power when the alternating current frequency increases; and reduce the output power when the alternating current frequency decreases.

Optionally, the output power is output active power or output reactive power, the output active power is an average value of instantaneous power output by the inverter in a cycle, and the output reactive power is a power value of energy exchange of the inverter in a cycle.

Optionally, the inverter works in a grid forming mode, and the inverter maintains voltage and frequency stability of a photovoltaic power supply system.

The detection unit 1101 of the apparatus 110 is configured to perform step 301 in the method embodiment in FIG. 3, the adjustment unit 1102 of the apparatus 110 is configured to perform step 302 in the method embodiment in FIG. 3, and the reporting unit 1103 is configured to perform step 303 in the method embodiment in FIG. 3. Details are not described herein again.

Figure 12:
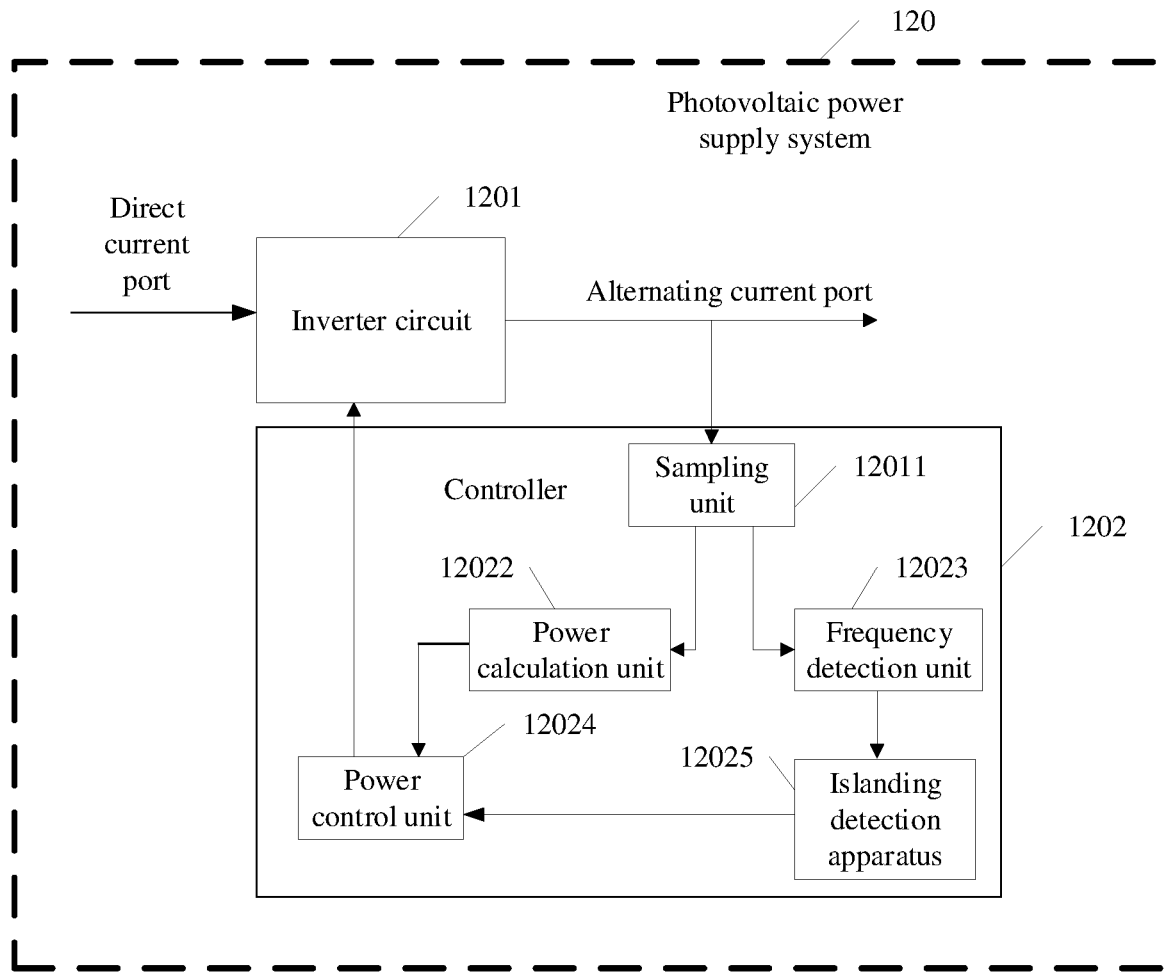
FIG. 12 is a schematic diagram of a structure of another photovoltaic power supply system according to an embodiment.

An embodiment may provide a photovoltaic power supply system 120. A system structure of the photovoltaic power supply system is shown in FIG. 12 and includes an inverter circuit 1201 and a controller 1202.

The inverter circuit 1201 is configured to convert direct current electric energy to alternating current electric energy.

The controller 1202 includes a sampling unit 12021, a power calculation unit 12022, a frequency detection unit 12023, a power control unit 12024, and an islanding detection apparatus 12025. The sampling unit 12021, the power calculation unit 12022, the frequency detection unit 12023, and the power control unit 12024 are configured to perform functions of the sampling unit 2041, the power calculation unit 2042, the frequency detection unit 2043, and the power control unit 2044 in FIG. 2.

The islanding detection apparatus 12025 is configured to detect an alternating current frequency of the inverter circuit 1201 from the frequency detection unit 12023 in real time. The alternating current frequency fluctuates within a preset range when the inverter circuit 1201 is in a normal control mode. After an instantaneous shifting value of the alternating current frequency exceeds the preset range, when all frequencies in first frequency data within a first preset time period are greater than or less than only a first frequency, output power of the inverter circuit 1201 is continuously adjusted based on a change in the alternating current frequency by using the power control unit 12024. The first frequency is an alternating current frequency detected before the instantaneous shifting value exceeds the preset range, and the output power is used to affect a magnitude of the alternating current frequency. When all frequencies in second frequency data of the alternating current frequency within a second preset time period are greater than or less than only a second frequency, an islanding status is reported. The second frequency is an alternating current frequency detected when the first preset time period ends, and the islanding status indicates that islanding occurs in the inverter circuit 1201 and triggers inverter protection, for example, disconnecting the inverter from a local load. The islanding detection apparatus 12025 may implement the functions and/or various steps implemented by the islanding detection apparatus in the method embodiment in FIG. 3.

Figure 13:
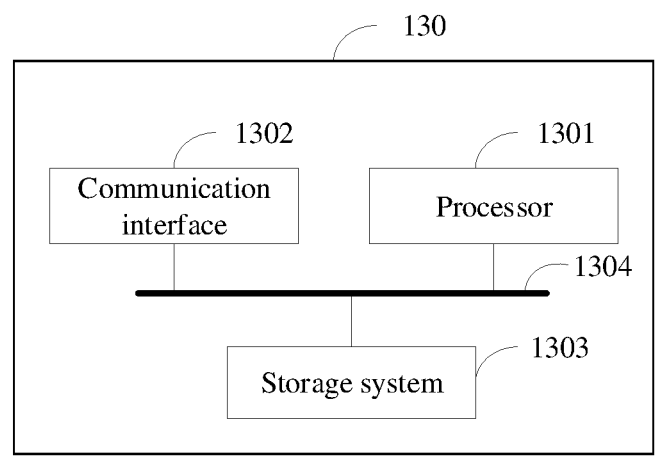
FIG. 13 is a schematic diagram of a structure of a computer device according to an embodiment.

FIG. 13 is a schematic diagram of a possible logical structure of a computer device 130 according to an embodiment. The computer device 130 includes a processor 1301, a communication interface 1302, a storage system 1303, and a bus 1304. The processor 1301, the communication interface 1302, and the storage system 1303 are connected to each other through the bus 1304. In this embodiment, the processor 1301 is configured to control and manage an action of the computer device 130. For example, the processor 1301 is configured to perform the steps performed by the islanding detection apparatus in the method embodiment in FIG. 3. The communication interface 1302 is configured to support the computer device 130 to perform communication. The storage system 1303 is configured to store program code and data of the computer device 130.

The processor 1301 may be a central processing unit, a general-purpose processor, a digital signal processor, an application-specific integrated circuit, a field programmable gate array or another programmable logic device, a transistor logic device, a hardware component, or any combination thereof. The processor may implement or execute various example logical blocks, modules, and circuits described with reference to the content. Alternatively, the processor 1301 may be a combination implementing a computing function, for example, a combination of one or more microprocessors or a combination of a digital signal processor and a microprocessor. The bus 1304 may be a Peripheral Component Interconnect (PCI) bus, an Extended Industry Standard Architecture (EISA) bus, or the like. Buses may be classified into an address bus, a data bus, a control bus, and the like. For ease of representation, only one bold line is used to represent the bus in FIG. 13, but this does not mean that there is only one bus or only one type of bus.

The detection unit 1101, the adjustment unit 1102, and the reporting unit 1103 in the apparatus 110 are equivalent to the processor 1301 in the computer device 130.

The computer device 130 in this embodiment may correspond to the islanding detection apparatus in the method embodiment in FIG. 3. The communication interface 1302 in the computer device 130 may implement functions and/or various steps implemented by the islanding detection apparatus in the method embodiment in FIG. 3. For brevity, details are not described herein again.

It should be understood that division of units in the apparatus is merely logical function division. During actual implementation, all or some of the units may be integrated into one physical entity or may be physically separated. In addition, all the units in the apparatus may be implemented in a form in which a processing element invokes software or may be implemented in a form of hardware; or some units may be implemented in a form in which a processing element invokes software, and some units are implemented in a form of hardware. For example, each unit may be a separately disposed processing element, or may be integrated into a chip of the apparatus for implementation. In addition, each unit may alternatively be stored in a memory in a form of a program to be invoked by a processing element of the apparatus to perform a function of the unit. In addition, all or some of the units may be integrated, or may be implemented independently. The processing element herein may also be referred to as a processor and may be an integrated circuit having a signal processing capability. During implementation, steps in the foregoing methods or the foregoing units may be implemented by using a hardware integrated logic circuit in a processor element or may be implemented in the form of software invoked by the processing element.

In an example, the unit in any one of the foregoing apparatuses may be one or more integrated circuits configured to implement the foregoing method, for example, one or more application-specific integrated circuit (ASIC), or one or more microprocessors (digital signal processor, DSP), or one or more field programmable gate array (FPGA), or a combination of at least two of these integrated circuit forms. For another example, when the unit in the apparatus may be implemented in a form of scheduling a program by the processing element, the processing element may be a general-purpose processor, for example, a central processing unit (CPU) or another processor that can invoke the program. For still another example, the units may be integrated and implemented in a form of a system-on-a-chip (SOC).

According to another embodiment, a non-transitory computer-readable storage medium is further provided. The non-transitory computer-readable storage medium stores computer-executable instructions. When a processor of a device executes the computer-executable instructions, the device performs the method performed by the islanding detection apparatus in the foregoing method embodiment.

According to another embodiment, a computer program product is further provided. The computer program product includes computer-executable instructions, and the computer-executable instructions are stored in a computer-readable storage medium. When a processor of a device executes the computer-executable instructions, the device performs the method performed by the islanding detection apparatus in the foregoing method embodiment.

It may be clearly understood by a person skilled in the art that, for the purpose of convenient and brief description, for detailed working processes of the foregoing system, apparatus, and unit, refer to corresponding processes in the foregoing method embodiments. Details are not described herein again.

In the several embodiments, it should be understood that the disclosed system, apparatus, and method may be implemented in other manners. For example, the described apparatus embodiment is merely an example. For example, division into the units is merely logical function division and may be other division during actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or another form.

The units described as separate parts may or may not be physically separate, and parts displayed as units may or may not be physical units, that is, may be located in one position, or may be distributed on a plurality of network units. Some or all of the units may be selected based on actual requirements to achieve the objectives of the embodiments.

In addition, function units in the embodiments may be integrated into one processing unit, each of the units may exist alone physically, or two or more units are integrated into one unit. The integrated unit may be implemented in a form of hardware or may be implemented in a form of a software function unit.

When the integrated unit is implemented in the form of a software function unit and sold or used as an independent product, the integrated unit may be stored in a computer-readable storage medium. Based on such an understanding, the embodiments essentially, or the part contributing to the conventional technology, or all or some of the solutions may be implemented in the form of a software product. The computer software product is stored in a storage medium and includes several instructions for instructing a computer device (which may be a personal computer, a server, a network device, or the like) to perform all or some of the steps of the methods described in the embodiments. The foregoing storage medium includes any medium that can store program code, such as a USB flash drive, a removable hard disk, a read-only memory (ROM), a random access memory (RAM), a magnetic disk, or an optical disc.

What is claimed is:

1. An islanding detection method, comprising:
   detecting an alternating current frequency of an inverter in real time, wherein the alternating current frequency fluctuates within a preset range when the inverter is in a normal control mode;
   after an instantaneous shifting value of the alternating current frequency exceeds the preset range, wherein the first frequency is an alternating current frequency detected before the instantaneous shifting value exceeds the preset range and the instantaneous shifting value represents a change from the first frequency, determining whether frequencies in first frequency data within a first preset time period are both greater than and less than the first frequency or whether all frequencies in the first frequency data are only one of greater than or less than the first frequency, and, in the case when all frequencies in the first frequency data are only one of greater than or less than the first frequency, continuously adjusting output power of the inverter based on a change in the alternating current frequency, and the output power is used to affect a magnitude of the alternating current frequency; and
   upon expiration of the first preset time period, triggering determination of a second frequency, wherein the second frequency is an alternating current frequency detected when the first preset time period ends, and, only in a case when all frequencies in second frequency data of the alternating current frequency within a second preset time period are only one of greater than or less than the second frequency, reporting an islanding status, wherein the islanding status indicates that islanding occurs in the inverter.

2. The islanding detection method according to claim 1, wherein before the islanding occurs in the inverter, the method further comprises:
   when the frequency in the second frequency data does not meet a preset frequency range, triggering a step of reporting the islanding status.

3. The islanding detection method according to claim 1, wherein the continuously adjusting output power of the inverter based on the change in the alternating current frequency further comprises:
   increasing the output power when the alternating current frequency increases; and
   reducing the output power when the alternating current frequency decreases.

4. The islanding detection method according to claim 1, wherein the output power is output active power or output reactive power, the output active power is an average value of instantaneous power output by the inverter in a cycle, and the output reactive power is a power value of energy exchange of the inverter in a cycle.

5. The islanding detection method according to claim 1, wherein the inverter works in a grid forming mode, and the inverter is configured to maintain voltage and frequency stability of a photovoltaic power supply system.

6. An islanding detection apparatus, comprising:
   a detection unit configured to detect an alternating current frequency of an inverter in real time, wherein the alternating current frequency fluctuates within a preset range when the inverter is in a normal control mode;
   an adjustment unit configured to:
   after an instantaneous shifting value of the alternating current frequency exceeds the preset range, wherein the first frequency is an alternating current frequency detected before the instantaneous shifting value exceeds the preset range and the instantaneous shifting value represents a change from the first frequency, determining whether frequencies in first frequency data within a first preset time period are both greater than and less than the first frequency or whether all frequencies in the first frequency data are only one of greater than or less than the first frequency, and, in the case when all frequencies in the first frequency data are only one of greater than or less than the first frequency, continuously adjust output power of the inverter based on a change in the alternating current frequency, and the output power is used to affect a magnitude of the alternating current frequency; and
   a reporting unit configured to:
   upon expiration of the first preset time period, triggering determination of a second frequency, wherein the second frequency is an alternating current frequency detected when the first preset time period ends, and, only in a case when all frequencies in second frequency data of the alternating current frequency within a second preset time period are only one of greater than or less than the second frequency, report an islanding status, wherein the islanding status indicates that islanding occurs in the inverter.

7. The islanding detection apparatus according to claim 6, further comprising:
   a determining unit configured to:
   when the frequency in the second frequency data does not meet a preset frequency range, trigger the reporting unit.

8. The islanding detection apparatus according to claim 6, wherein the adjustment unit is further configured to:
   increase the output power when the alternating current frequency increases; and
   reduce the output power when the alternating current frequency decreases.

9. The islanding detection apparatus according to claim 6, wherein the output power is output active power or output reactive power, the output active power is an average value of instantaneous power output by the inverter in a cycle, and the output reactive power is a power value of energy exchange of the inverter in a cycle.

10. The islanding detection apparatus according to claim 6, wherein the inverter works in a grid forming mode, and the inverter maintains voltage and frequency stability of a photovoltaic power supply system.

11. A photovoltaic power supply system, comprising an inverter circuit and a controller, wherein
    the inverter circuit is configured to convert direct current electric energy to alternating current electric energy; and
    the controller comprises the apparatus according to claim 6.

* * * * *